(12) United States Patent
Matsuzuka et al.

(10) Patent No.: US 8,354,888 B2
(45) Date of Patent: Jan. 15, 2013

(54) POWER AMPLIFIER

(75) Inventors: Takayuki Matsuzuka, Tokyo (JP);
Kazuya Yamamoto, Tokyo (JP); Takao Moriwaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/195,051

(22) Filed: Aug. 1, 2011

(65) Prior Publication Data

US 2012/0146733 A1 Jun. 14, 2012

(30) Foreign Application Priority Data

Dec. 13, 2010 (JP) .................................. 2010-276654

(51) Int. Cl.
*H03F 3/04* (2006.01)

(52) U.S. Cl. .......................... 330/296; 330/302; 330/285

(58) Field of Classification Search .................. 330/285, 330/296, 310, 98, 133, 150
See application file for complete search history.

(56) References Cited

U.S. PATENT DOCUMENTS

| 6,946,913 | B2 | 9/2005 | Moriwaki et al. | |
|---|---|---|---|---|
| 7,012,469 | B2 | 3/2006 | Moriwaki et al. | |
| 7,688,133 | B2 * | 3/2010 | Yamamoto et al. | ............. 330/51 |
| 2011/0018639 | A1 | 1/2011 | Matsuzuka et al. | |

FOREIGN PATENT DOCUMENTS

| JP | 2004-274433 A | 9/2004 |
|---|---|---|
| JP | 2004-343244 A | 12/2004 |
| JP | 2011-30006 A | 2/2011 |

* cited by examiner

*Primary Examiner* — Hieu Nguyen
(74) *Attorney, Agent, or Firm* — Leydig, Voit & Mayer, Ltd.

(57) ABSTRACT

A power amplifier includes an input matching circuit, an amplifier transistor for amplifying an input signal received through the input matching circuit, an element for varying the collector voltage of the amplifier transistor, a bias circuit for varying the idle current in the amplifier transistor, and a compensation circuit for varying capacitance of the input matching circuit to maintain the phase shift and the input reflection in the power amplifier constant when the collector voltage and the idle current are varied, to prevent a decrease in the efficiency of the power amplifier due to changes in the output power of the amplifier transistor.

11 Claims, 8 Drawing Sheets

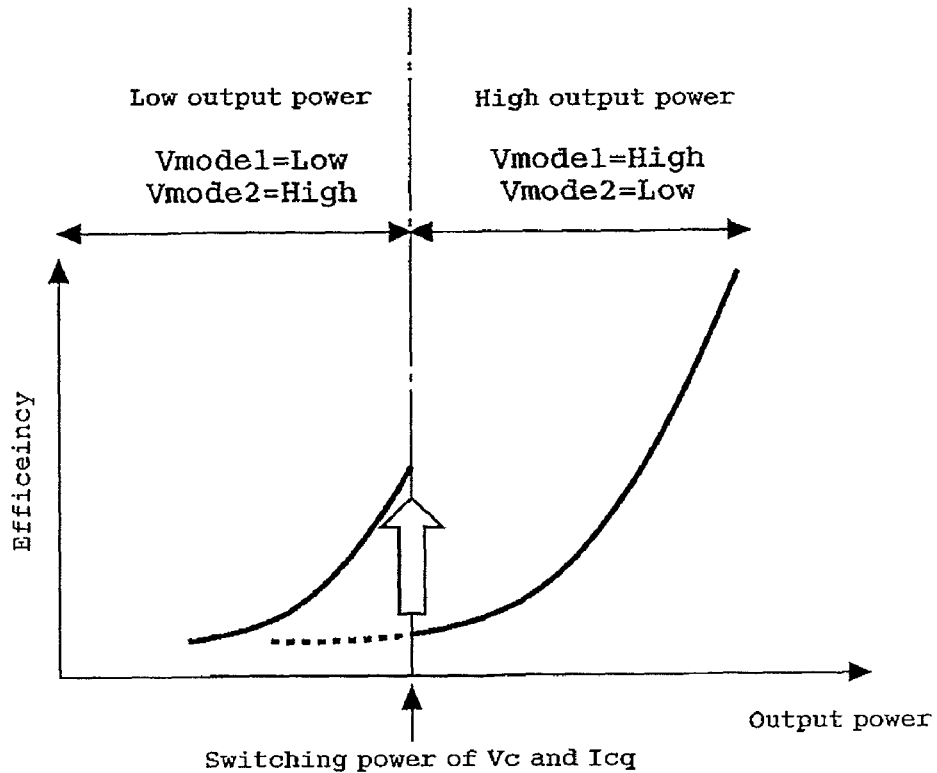
F I G. 3
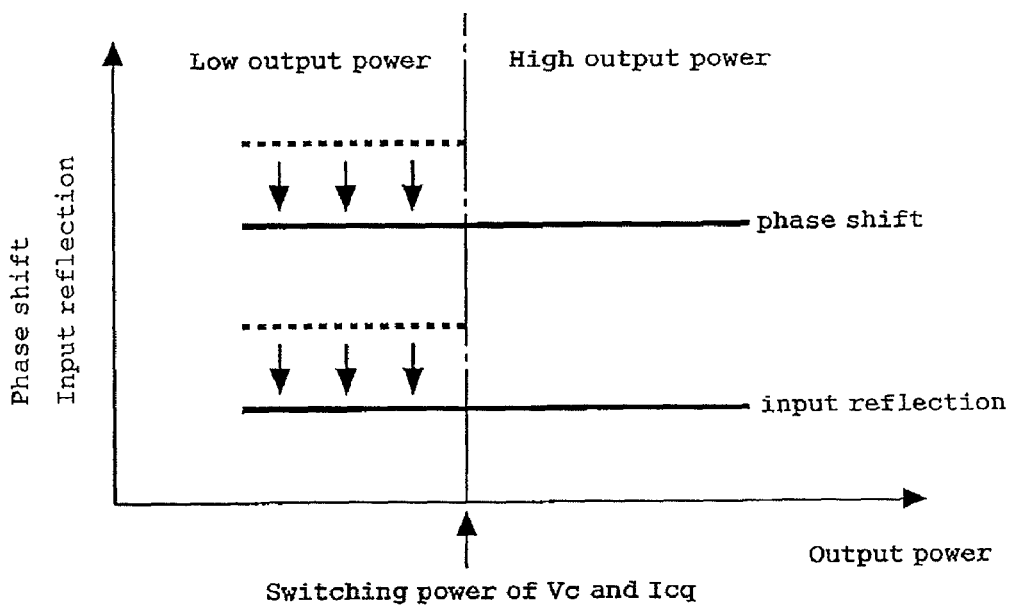
F I G. 4

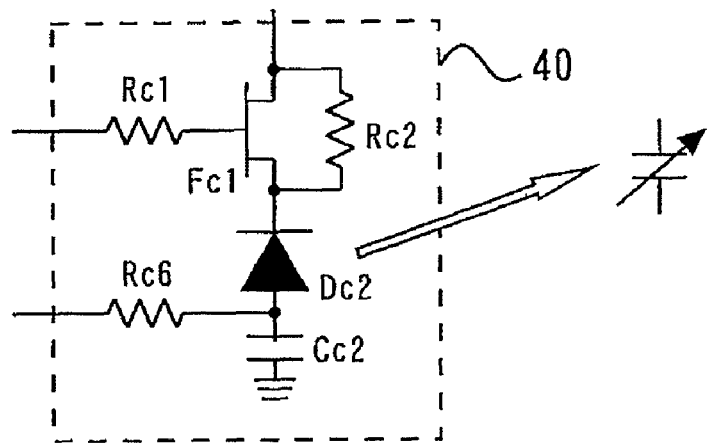
F I G. 9
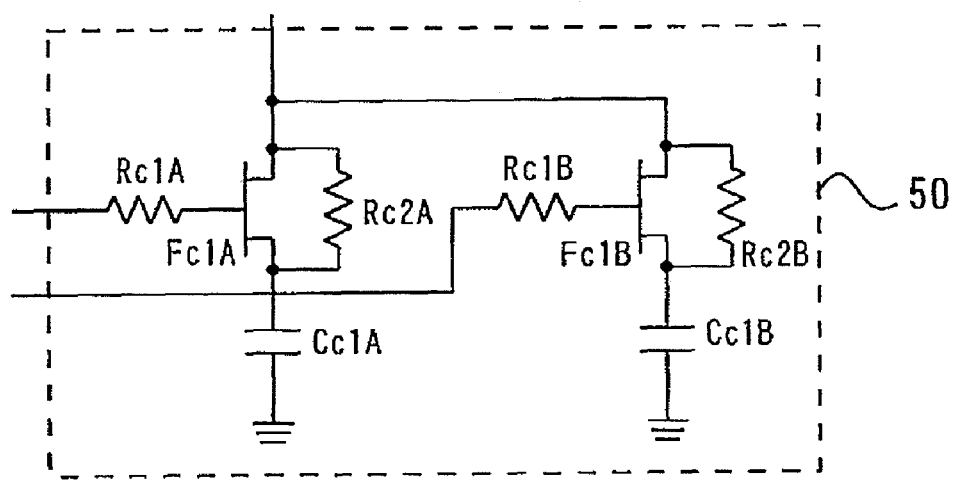
F I G. 10

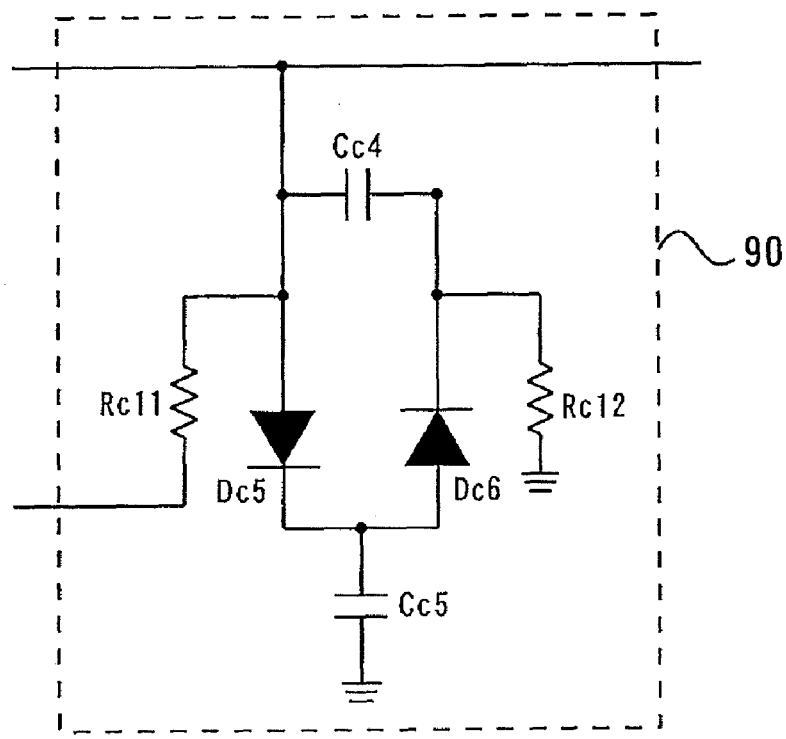
F I G. 1 5
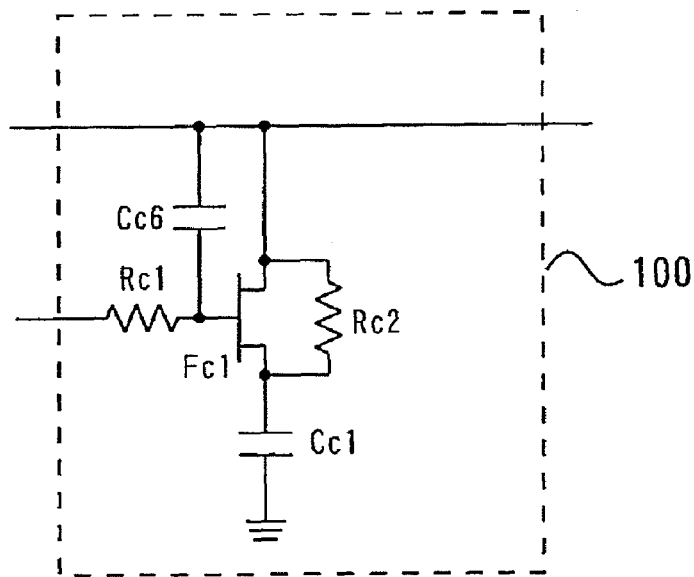
F I G. 1 6

POWER AMPLIFIER

BACKGROUND OF THE INVENTION

1. Field of the Invention

The present invention relates to a power amplifier in which the collector voltages and idle currents of the amplifier transistors are varied.

2. Background Art

Japanese Laid-Open Patent Publication No. 2004-274433 discloses a power amplifier in which the collector voltage Vc and the idle current Icq of the amplifier transistor (or high frequency transistor) are varied in accordance with the output power level of the amplifier transistor. Specifically, in this power amplifier, the collector voltage Vc and the idle current Icq are increased when the output power is high and decreased when the output power is low, thereby improving the efficiency of the power amplifier even at low output power levels.

W-CDMA systems require that the phase shift in the power amplifiers in the system be constant regardless of their output power level. Further, the power amplifiers must also have optimum input reflection characteristics regardless of their output power level in order to prevent degradation of the input reflection level.

However, changing the collector voltage Vc and the idle current Icq of an amplifier transistor, as in the power amplifier disclosed in the above patent publication, results in a change in the S-parameters of the transistor and a corresponding change in the phase shift and the input reflection in the transistor.

SUMMARY OF THE INVENTION

The present invention has been made to solve the above problems. It is, therefore, an object of the present invention to provide a power amplifier in which the collector voltages Vc and the idle currents Icq of the amplifier transistors can be varied so as to increase the efficiency of the power amplifier at both high and low output power levels while maintaining constant the phase shift and the input reflection in the amplifier.

According to one aspect of the present invention, a power amplifier includes an amplifier transistor for amplifying an input signal received through an input matching circuit, means for varying the collector voltage of the amplifier transistor, a bias circuit for varying the idle current in the amplifier transistor, and a compensation circuit for varying the value of a capacitance of the input matching circuit so as to maintain constant the phase shift and the input reflection in the power amplifier when the collector voltage and the idle current are varied to prevent a decrease in the efficiency of the power amplifier due to changes in the output power of the amplifier transistor.

Other and further objects, features and advantages of the invention will appear more fully from the following description.

BRIEF DESCRIPTION OF THE DRAWINGS

FIG. 3 is a diagram showing the efficiency of the power amplifier when it is operated at high and low output power levels;

FIG. 4 is a diagram showing the way in which the phase shift and the input reflection in the power amplifier of the first embodiment are maintained constant when the collector voltages Vc and the idle currents Icq of the amplifier transistors of the amplifier are varied;

FIG. 9 is a diagram showing the compensation circuit of a power amplifier in accordance with a third embodiment of the present invention;

FIG. 10 is a diagram showing the compensation circuit of a power amplifier in accordance with a fourth embodiment of the present invention;

FIG. 15 is a diagram showing a variation of the compensation circuit of the power amplifier of the seventh embodiment; and FIG. 16 is a diagram showing the compensation circuit of a power amplifier in accordance with an eighth embodiment of the present invention.

DETAILED DESCRIPTION OF THE PREFERRED EMBODIMENTS

First Embodiment

Figure 1:
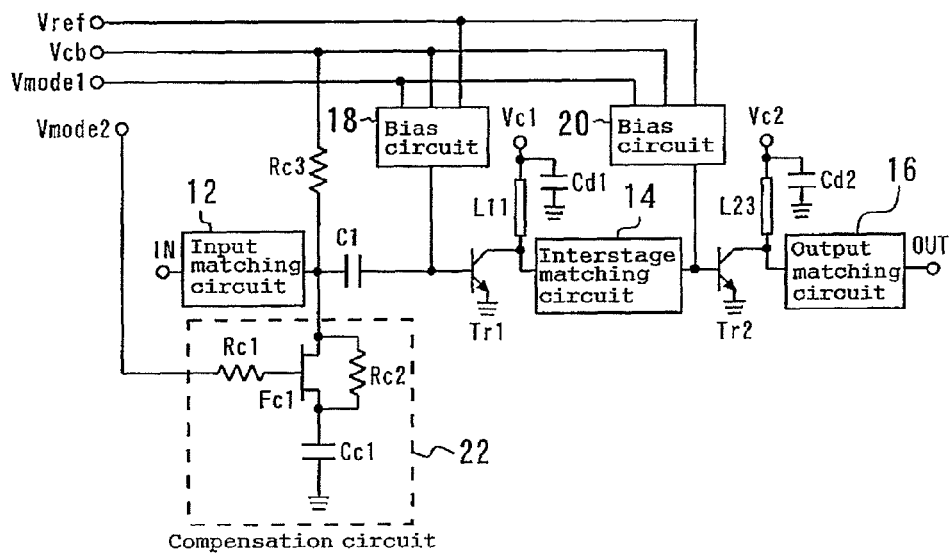
FIG. 1 is a diagram showing a power amplifier in accordance with a first embodiment of the present invention.

FIG. 1 is a diagram showing a power amplifier in accordance with a first embodiment of the present invention. The power amplifier 10 includes an input terminal IN and an output terminal OUT. One end of an input matching circuit 12 is connected to the input terminal IN. The base of an amplifier transistor Tr1 is connected to the other end of the input matching circuit 12 through a capacitance C1. The amplifier transistor Tr1 is a hetero junction bipolar transistor (HBT). A collector voltage terminal Vc1 and a capacitance Cd1 are connected to the collector of the amplifier transistor Tr1 through a transmission line L11 having a predetermined electrical length.

One end of an interstage matching circuit 14 is also connected to the collector of the amplifier transistor Tr1. The base of an amplifier transistor Tr2 is connected to the other end of the interstage matching circuit 14. The amplifier transistor Tr2 is an HBT. A collector voltage terminal Vc2 and a capacitance Cd2 are connected to the collector of the amplifier transistor Tr2 through a transmission line L23 having a predetermined electrical length. One end of an output matching circuit 16 is also connected to the collector of the amplifier transistor Tr2. The other end of the output matching circuit 16 is connected to the output terminal OUT. It should be noted that the collector voltage terminals Vc1 and Vc2 are controlled by a DC-DC converter outside the power amplifier 10.

Figure 2:
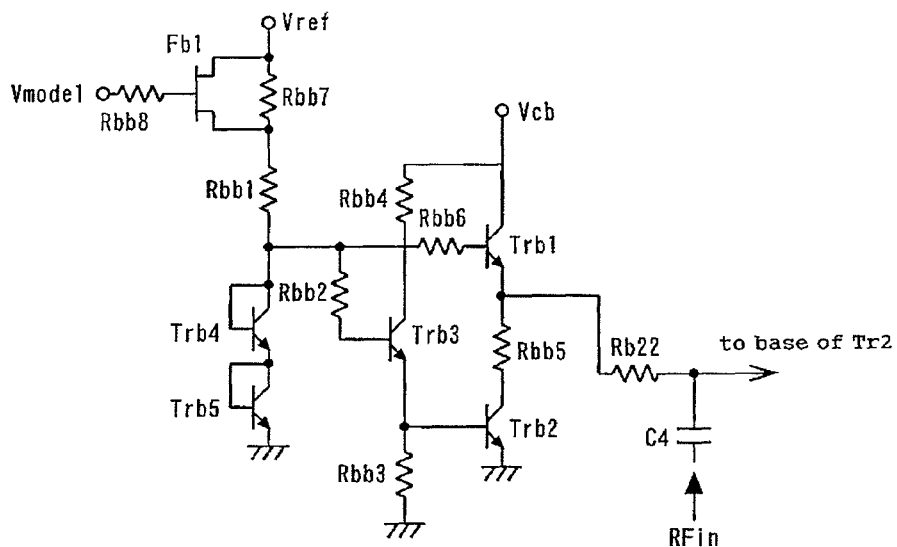
FIG. 2 is a diagram showing the configuration of each bias circuit of the first embodiment.

A bias circuit 18 is connected to the base of the amplifier transistor Tr1. A bias circuit 20 is connected to the base of the amplifier transistor Tr2. The bias circuits 18 and 20 are used to control the idle currents in the amplifier transistors Tr1 and Tr2, respectively. The bias circuits 18 and 20 are connected to a reference voltage terminal Vref, a power supply voltage terminal Vcb, and a control signal terminal Vmode1 for the bias circuits. The configurations of the bias circuits 18 and 20 will be described with reference to FIG. 2. FIG. 2 is a diagram showing the configuration of each bias circuit of the first embodiment. In these bias circuits 18 and 20, a transistor Fb1 is turned on and off by turning on and off the application of a voltage to the control signal terminal Vmode1. When the transistor Fb1 is turned on, power is supplied from the terminal Vref to the circuit through the transistor Fb1, and when the transistor Fb1 is turned off, power is supplied from Vref to the circuit through a resistance Rbb7.

Referring back to FIG. 1, a compensation circuit 22 is connected to the other end of the input matching circuit 12. The compensation circuit 22 includes a transistor Fc1, resistances Rc1 and Rc2, and a capacitance Cc1 (a shunt capacitance). The source of the transistor Fc1 is connected to the other end of the input matching circuit 12, and the drain is connected to the capacitance Cc1. The resistance Rc2 is connected between the source and the drain of the transistor. The gate of the transistor Fc1 is connected to a control signal terminal Vmode2 through the resistance Rc1. The capacitance Cc1 is connected between the drain of the transistor and the ground.

The operation of the power amplifier 10 of the first embodiment will now be described. The power amplifier 10 is configured to operate at high output power levels, e.g., approximately 26-29 dBm, and at low output power levels, e.g., 10 dBm or less. FIG. 3 is a diagram showing the efficiency of the power amplifier when it is operated at high and low output power levels. First the operation of the power amplifier at high output power levels will be described. When the power amplifier is to be operated at high output power levels, the voltage at the control signal terminal Vmode1 is set at a High level, thereby turning on the transistors Fb1 of the bias circuits 18 and 20. In each bias circuit 18, 20, when the transistor Fb1 is turned on, substantially no current flows through the resistance Rbb7, so that there is substantially no voltage drop from the voltage at the reference voltage terminal Vref. As a result, the idle currents Icq in the amplifier transistors Tr1 and Tr2 increase. It should be noted that the collector voltages Vc of the amplifier transistors Tr1 and Tr2 are set at a high level in this state.

When the power amplifier is operated at high output power levels, the voltage at the control signal terminal Vmode2 is set at a Low level. This turns off the transistor Fc1 in the compensation circuit 22, i.e., drives the transistor into a nonconducting state, so that the capacitance Cc1 is disconnected from the input matching circuit 12.

When the power amplifier is to be operated at low output power levels, on the other hand, the voltage at the control signal terminal Vmode1 is set at a Low level, thereby turning off the transistors Fb1 of the bias circuits 18 and 20. In each bias circuit 18, 20, when the transistor Fb1 is turned off, a current flows through the resistance Rbb7, so that there is a voltage drop from the voltage at the reference voltage terminal Vref. As a result, the idle currents Icq in the amplifier transistors Tr1 and Tr2 decrease. It should be noted that the collector voltages Vc of the amplifier transistors Tr1 and Tr2 are set at a low level in this state.

When the power amplifier is operated at low output power levels, the voltage at the control signal terminal Vmode2 is set at a High level. This turns on the transistor Fc1 in the compensation circuit 22, i.e., drives the transistor into a conducting state, so that the capacitance Cc1 is connected to the input matching circuit 12. Thus, the compensation circuit 22 is operated in synchronization with the control of the collector voltages Vc and the idle currents Icq.

It should be noted that the power amplifier 10 of the first embodiment is designed to exhibit the highest efficiency and minimal distortion characteristics when it is operated at high output power levels. Further, in order to prevent degradation of the distortion characteristics and the efficiency of the power amplifier 10 at low output power levels, the collector voltages Vc and the idle currents Icq are maintained lower when the amplifier is operated at low output power levels than when it is operated at high output power levels. This improves the distortion characteristics and the efficiency of the power amplifier 10 at low output power levels, as well as at high output power levels. It will be noted that in FIG. 3 the dashed line indicates the efficiency of the power amplifier at low output power levels when the collector voltages Vc and the idle currents Icq are set at high levels. As shown, in this state, the efficiency of the power amplifier is low, as indicated by the dashed line. On the other hand, in accordance with the first embodiment, the power amplifier 10 has high efficiency even at low output power levels, as indicated by a solid line in FIG. 3. Specifically, in accordance with the first embodiment, the efficiency of the power amplifier at an output power level of 7 dBm can be increased from approximately 2% to approximately 7% (as indicated by the white arrow in FIG. 3).

Thus, Vc and Icq are set at different levels when the power amplifier is operated at high and low output power levels. This results in a difference of a few tens of degrees between the phase shifts introduced by the power amplifier at high and low output power levels (if the amplifier is not provided with the compensation circuit 22). More specifically, the phase shift in the power amplifier when the amplifier is operated at low output power levels is a few tens of degrees greater than when the amplifier is operated at high output power levels. This means that the power amplifier is not adapted for use in W-CDMA systems, which require that the phase shift in the power amplifiers in the system be constant regardless of their output power level.

Further, since Vc and Icq are set at different levels when the power amplifier is operated at high and low output power levels, the impedance as seen from the base of each amplifier transistor Tr1, Tr2 toward the transistor is different when the amplifier is operated at high and low output power levels. This difference in impedance results in degradation of the input reflection in the power amplifier at low output power levels, since the input reflection in the power amplifier is optimized when the amplifier is operated at high output power levels.

On the other hand, in accordance with the configuration of the power amplifier 10 of the first embodiment, it is possible to vary the collector voltages Vc and the idle currents Icq so as to increase the efficiency of the power amplifier while maintaining constant the phase shift and the input reflection in the power amplifier. This feature will be described with reference to FIG. 4. FIG. 4 is a diagram showing the way in which the phase shift and the input reflection in the power amplifier of the first embodiment are maintained constant when the collector voltages Vc and the idle currents Icq of the amplifier transistors of the amplifier are varied. This is accomplished by setting the voltage of the control signal terminal Vmode2 at a High level and thereby connecting the capacitance Cc1 to the input matching circuit 12 when the power amplifier is operated at low output power levels. It should be noted that in FIG. 4 the dashed lines indicate the phase shift and the input reflection in the power amplifier without the compensation circuit 22.

Figure 5:
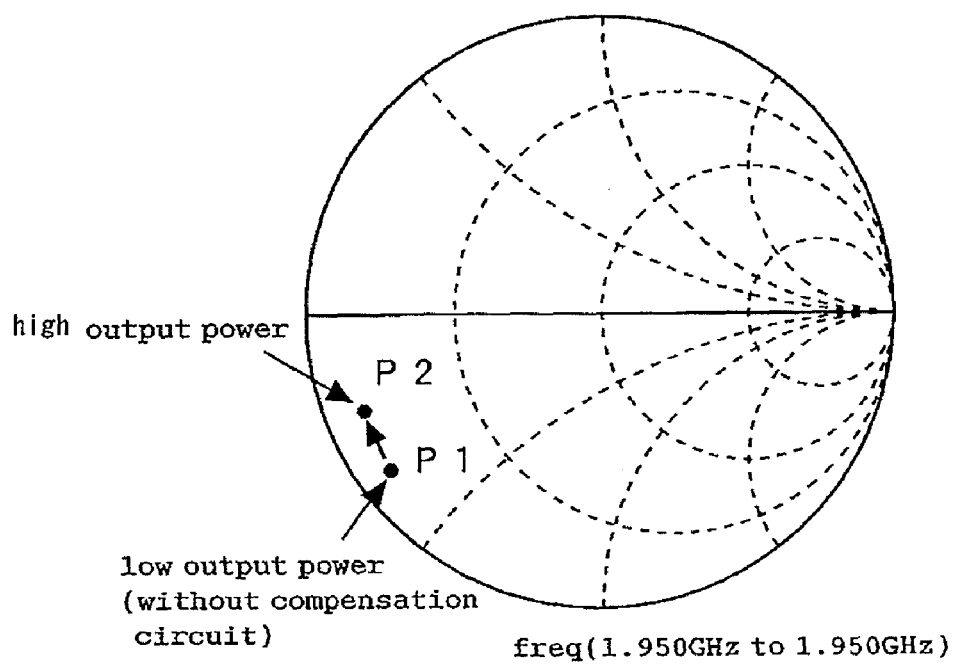
FIG. 5 is a Smith chart showing impedances as seen from the base of the amplifier transistor Tr1 toward the amplifier transistor Tr1.

FIG. 5 is a Smith chart showing impedances as seen from the base of the amplifier transistor Tr1 toward the amplifier transistor Tr1 when the power amplifier is operated at high and low output power levels. Without the compensation circuit 22, the impedance P1 when the power amplifier is operated at low output power levels significantly differs from the impedance P2 when the power amplifier is operated at high output power levels. However, with the compensation circuit 22, the impedance P1 can be made closer to the impedance P2, as indicated by the arrow in FIG. 5, since the capacitance Cc1 in the compensation circuit 22 is connected to the input matching circuit 12.

Thus, in the power amplifier 10 of the first embodiment, the collector voltages Vc and the idle currents Icq of the amplifier transistors can be varied so as to increase the efficiency of the power amplifier at low output power levels while maintaining constant the phase shift and the input reflection in the power amplifier.

In order for the power amplifier to have increased efficiency at high and low output power levels, it is only necessary that the power amplifier have means for varying the collector voltages Vc of the amplifier transistors and have bias circuits for varying the idle currents Icq in the amplifier transistors. This means that the configurations of these means for varying the collector voltages Vc and the configurations of these bias circuits are not limited to those described above.

Further, in order for the power amplifier to maintain constant the phase shift and input reflection therein when the collector voltages Vc and the idle currents Icq of the amplifier transistors are varied so as to prevent a decrease in the efficiency of the power amplifier due to changes in the output power level of the power amplifier, it is only necessary that the power amplifier be provided with a compensation circuit for changing the value of the capacitance of the input matching circuit 12. Therefore, the compensation circuit is not limited to the type which connects and disconnects a capacitance to and from the input matching circuit 12.

Further, although the power amplifier 10 of the first embodiment is designed to exhibit the highest efficiency and minimal distortion characteristics when it is operated at high output power levels, it is to be understood that the present invention is not limited to this particular type of power amplifier. The power amplifier 10 may be designed to exhibit the highest efficiency and minimal distortion characteristics when it is operated at low output power levels. The efficiency of such a power amplifier can also be increased at both high and low power levels while maintaining constant the phase shift and the input reflection in the power amplifier.

Second Embodiment

Figure 6:
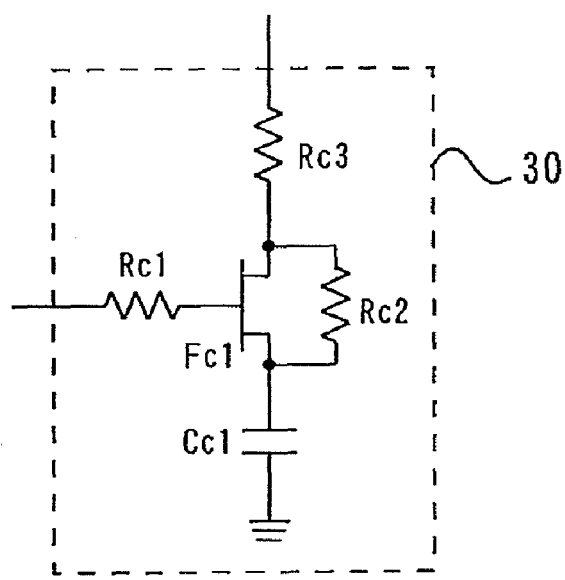
FIG. 6 is diagram showing the compensation circuit of a power amplifier in accordance with a second embodiment of the present invention.

FIG. 6 is a diagram showing the compensation circuit of a power amplifier in accordance with a second embodiment of the present invention. The components of this power amplifier, other than the compensation circuit, are the same as described above in connection with the first embodiment.

In the compensation circuit 30, a resistance Rc3 is connected in series to the capacitance Cc1. In this compensation circuit 30, when the transistor Fc1 is turned on power loss is incurred in the resistance Rc3, thereby decreasing the gain of the power amplifier. This means that the value of the resistance Rc3 may be varied to adjust the gain of the power amplifier when the transistor Fc1 is on.

Figure 7:
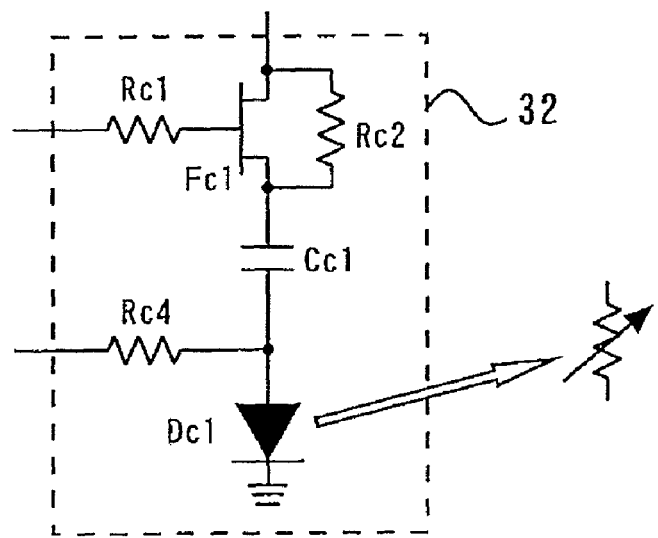
FIG. 7 is a diagram showing a variation of the compensation circuit of the power amplifier of the second embodiment.

FIG. 7 is a diagram showing a variation of the compensation circuit of the power amplifier of the second embodiment. This compensation circuit 32 differs from the compensation circuit 30 of FIG. 6 in that the resistance Rc3 is omitted and a variable resistance consisting of a resistance Rc4 and a diode Dc1 is connected between the capacitance Cc1 and the ground. A forward bias voltage may be applied across the diode Dc1 through the resistance Rc4 and adjusted to cause the diode Dc1 to function as a variable resistance. In this way the gain of the power amplifier can be controlled in an analog manner by electrically controlling the decrease in gain due to the variable resistance in an analog manner. It should be noted that any other type of variable resistance may be used.

Figure 8:
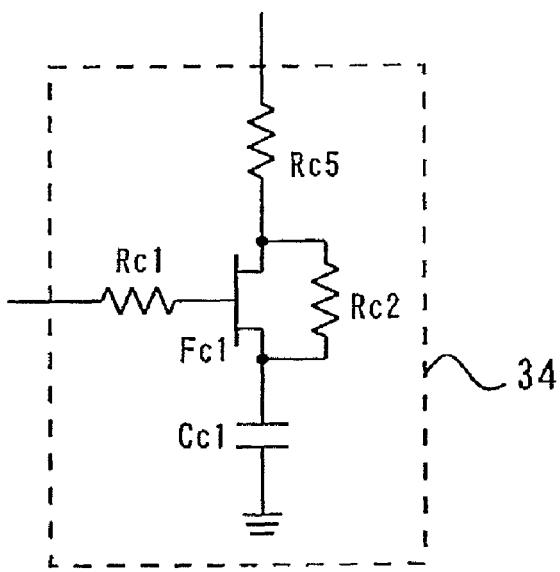
FIG. 8 is a diagram showing another variation of the compensation circuit of the power amplifier of the second embodiment.

FIG. 8 is a diagram showing another variation of the compensation circuit of the power amplifier of the second embodiment. This compensation circuit 34 differs from the compensation circuit 30 of FIG. 6 in that the resistance Rc3 is replaced by a resistance Rc5 formed from a semiconductor layer. The semiconductor layer from which the resistance Rc5 is formed may be, but is not limited to, e.g., the base layer. Since the value of the resistance Rc5 formed from the semiconductor layer varies with temperature (e.g., the value of a resistance formed from a base layer increases with temperature), the amount of decrease in gain due to the resistance Rc5 can be varied in accordance with temperature.

Third Embodiment

FIG. 9 is a diagram showing the compensation circuit of a power amplifier in accordance with a third embodiment of the present invention. The components of this power amplifier, other than the compensation circuit, are the same as described above in connection with the first embodiment.

In the compensation circuit 40, a resistance Rc6, a diode Dc2, and a capacitance Cc2 together form a variable capacitance. More specifically, this compensation circuit 40 differs from the compensation circuit 22 of the first embodiment in that the capacitance Cc1 is replaced by the variable capacitance consisting of the resistance Rc6, the diode Dc2, and the capacitance Cc2.

A reverse bias voltage is applied across the diode Dc2 through the resistance Rc6 and varied to vary the value of this variable capacitance. That is, by varying the voltage applied to Rc6, it is possible to vary the amount of compensation for the phase shift and the input reflection in the power amplifier. For example, when, due to manufacturing variations, there is a change in the differences between the amounts of phase shift and between the amounts of input reflection introduced by the power amplifier at high and low output power levels (i.e., when the collector voltages Vc and the idle currents Ic are set at different values), it is possible to electrically adjust the amount of compensation for these differences between the amounts of phase shift and between the amounts of input reflection. It should be noted that the capacitance Cc2 functions to block DC currents so that a voltage can be applied to the anode of the diode Dc2.

Fourth Embodiment

FIG. 10 is a diagram showing the compensation circuit of a power amplifier in accordance with a fourth embodiment of the present invention. The components of this power amplifier, other than the compensation circuit, are the same as described above in connection with the first embodiment.

The compensation circuit 50 is characterized by including two compensation circuits connected in parallel with each other. Specifically, the compensation circuit 50 includes two capacitances Cc1A and Cc1B which can be controlled independently of each other. The capacitance Cc1A is controlled by use of a resistance Rc1A and a transistor Fc1A. The capacitance Cc1B is controlled by use of a resistance Rc1B and a transistor Fc1B. Thus, either the capacitance Cc1A or the capacitance Cc1B, or both, can be selectively connected to the input matching circuit 12, making it possible for the compensation circuit 50 to provide three amounts of compensation.

Figure 11:
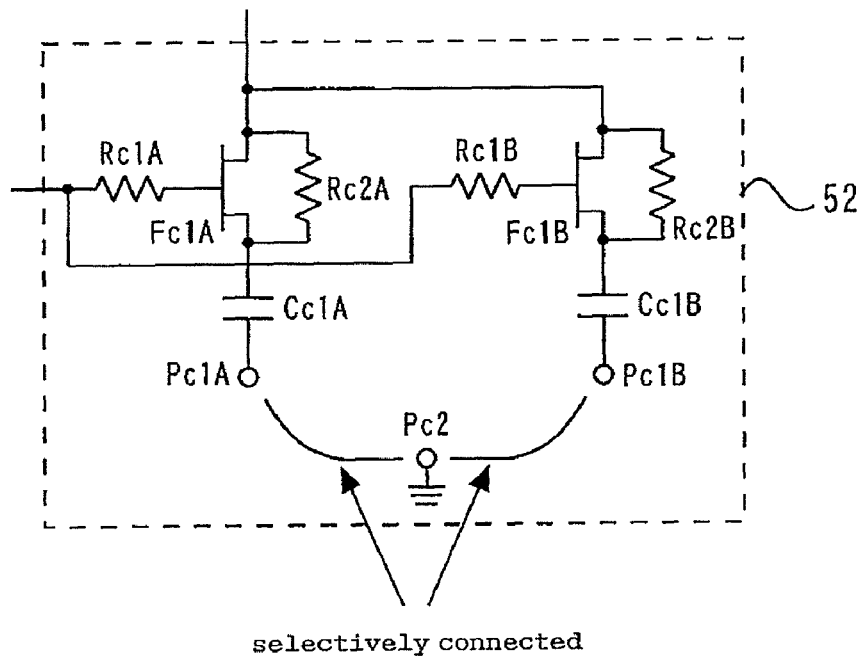
FIG. 11 is a diagram showing a variation of the compensation circuit of the power amplifier of the fourth embodiment.

FIG. 11 is a diagram showing a variation of the compensation circuit of the power amplifier of the fourth embodiment. In this compensation circuit 52, the two capacitances Cc1A and Cc1B of the two compensation circuits are connected to bonding pads Pc1A and Pc1B, respectively. Further, the compensation circuit 52 includes a wire bonding pad (or ground terminal) Pc2 connected to the ground. In this configuration of the compensation circuit 52, the wire bonding pad Pc2 can be selectively connected to either the wire bonding pad Pc1A or Pc1B, or both, making it possible for the compensation circuit 52 to provide a plurality of amounts of compensation. Further, only a single control signal is required to control this compensation circuit, as in the power amplifier of the first embodiment, although the compensation circuit provides a plurality of amounts of compensation.

Fifth Embodiment

Figure 12:
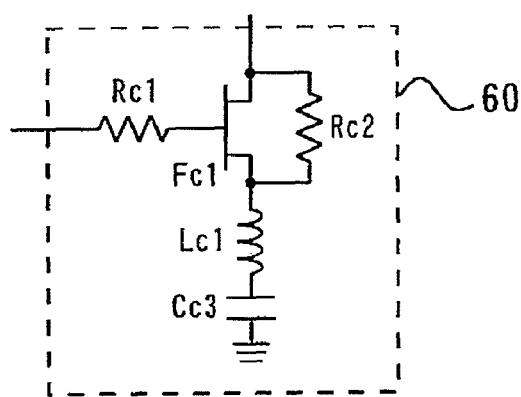
FIG. 12 is a diagram showing the compensation circuit of a power amplifier in accordance with a fifth embodiment of the present invention.

FIG. 12 is a diagram showing the compensation circuit of a power amplifier in accordance with a fifth embodiment of the present invention. The components of this power amplifier, other than the compensation circuit, are the same as described above in connection with the first embodiment.

The compensation circuit 60 is characterized in that an inductor Lc1 is connected in series to a capacitance Cc3. Since the inductor Lc1, not a capacitance, is connected to the input matching circuit 12 when the transistor Fc1 is turned on, the compensation circuit 60 compensates for the phase shift and the input reflection in the power amplifier in an opposite manner to the compensation circuit of the power amplifier of the first embodiment.

Sixth Embodiment

Figure 13:
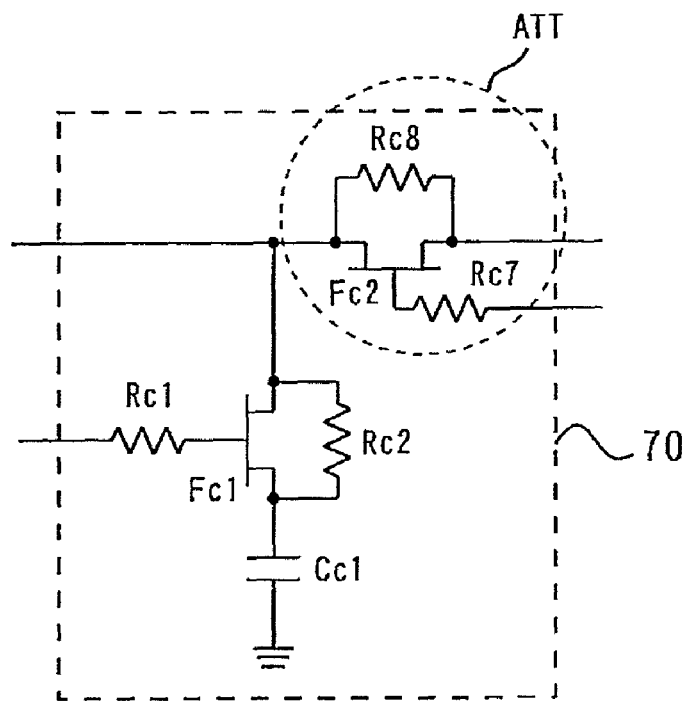
FIG. 13 is a diagram showing the compensation circuit of a power amplifier in accordance with a sixth embodiment of the present invention.

FIG. 13 is a diagram showing the compensation circuit of a power amplifier in accordance with a sixth embodiment of the present invention. The components of this power amplifier, other than the compensation circuit, are the same as described above in connection with the first embodiment.

The compensation circuit 70 is characterized by including an attenuator ATT. The attenuator ATT includes a transistor Fc2, a resistance Rc7, and a resistance Rc8. In this compensation circuit 70, when the transistor Fc1 is turned on, the transistor Fc2 is turned off, and when the transistor Fc1 is turned off, the transistor Fc2 is turned on. In this way, the RF signal (i.e., the input signal) can be attenuated when the capacitance Cc1 is connected to the input matching circuit 12 (i.e., when the transistor Fc1 is turned on). That is, by using this compensation circuit, it is possible to set the gain of the power amplifier to any desired value while compensating for the phase shift and the input reflection in the power amplifier. It should be noted that the amount of attenuation produced by the attenuator ATT can be adjusted to any desired value by the resistance Rc8.

Seventh Embodiment

Figure 14:
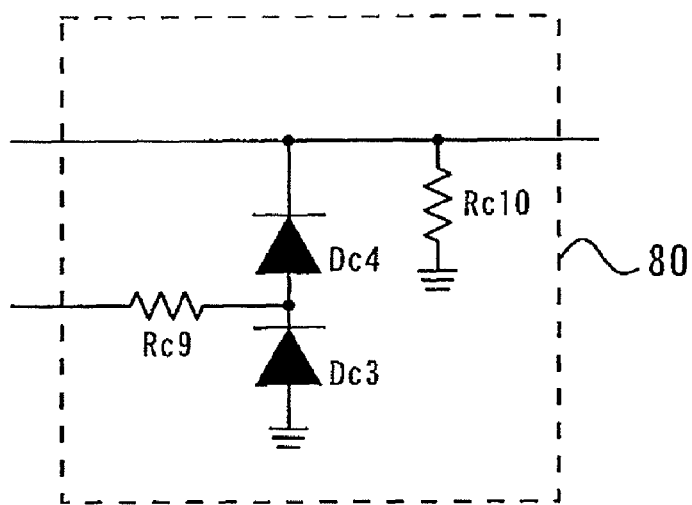
FIG. 14 is a diagram showing the compensation circuit of a power amplifier in accordance with a seventh embodiment of the present invention.

FIG. 14 is a diagram showing the compensation circuit of a power amplifier in accordance with a seventh embodiment of the present invention. The components of this power amplifier, other than the compensation circuit, are the same as described above in connection with the first embodiment.

The compensation circuit 80 includes, instead of a field effect transistor (FET), a first diode Dc3 and a second diode Dc4 which can be manufactured by a heterojunction bipolar transistor (HBT) process. When a voltage higher than the threshold voltage of the first diode Dc3 is applied to the resistance Rc9 connected to the junction between the first and second diodes Dc3 and Dc4, the second diode Dc4 is turned on, and the first diode Dc3 is reverse biased to function as a capacitance. Thus in the compensation circuit 80, the second diode Dc4, instead of an FET, functions as a switch. It should be noted that the resistance Rc9 and a resistance Rc10 are used to apply biases to the first and second diodes Dc3 and Dc4 and are preferably high enough not to affect the RF operation.

Thus, the compensation circuit 80 of the seventh embodiment uses, instead of an FET, the diodes Dc3 and Dc4 which can be manufactured by an HBT process. Therefore, the compensation circuit 80 can be manufactured at low cost. Further, the absence of FETs in the compensation circuit avoids variations in the characteristics (the amount of compensation and gain) of the circuit due to manufacturing variations of the FETs.

FIG. 15 is a diagram showing a variation of the compensation circuit of the power amplifier of the seventh embodiment. In this compensation circuit 90, a diode Dc5 and a diode Dc6 are connected in parallel to each other, forming a switch. Since this switch is made up of two diodes, it has a power capacity approximately 4 times that of the switch in the compensation circuit 80. It should be noted that a capacitance Cc4 serves to block DC currents and a capacitance Cc5 corresponds to the capacitance Cc1 in the compensation circuit 22 of the first embodiment. Further, a resistance Rc11 and a resistance Rc12 are used to apply biases to the diodes Dc5 and Dc6 and hence are preferably high enough not to affect the RF operation.

Eighth Embodiment

FIG. 16 is a diagram showing the compensation circuit of a power amplifier in accordance with an eighth embodiment of the present invention. The components of this power amplifier, other than the compensation circuit, are the same as described above in connection with the first embodiment.

The compensation circuit 100 is characterized in that a capacitance Cc6 is connected between the gate and drain of the transistor Fc1 which is an FET used to connect and disconnect the capacitance Cc1. Since this capacitance Cc6 serves to increase the power capacity of the transistor Fc1, the transistor Fc1 can handle the power required to switch the collector voltages Vc and the idle currents Icq of the amplifier transistors between high and low levels, even if the required power is high. That is, there is no need for additional transistors, thereby minimizing the increase in the chip area of the MMIC.

It should be noted that in FIGS. 13 to 16, the horizontal line passing through the compensation circuit indicates the wiring between the input matching circuit 12 and the capacitance C1 shown in FIG. 1.

Thus the present invention provides a power amplifier in which the collector voltages Vc and the idle currents Icq of the amplifier transistors can be varied so as to increase the efficiency of the power amplifier while maintaining constant the phase shift and the input reflection in the amplifier.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-276654, filed on Dec. 13, 2010 including specification, claims, drawings and summary, on which the Convention priority of the present application is based, are incorporated herein by reference in its entirety.

What is claimed is:

1. A power amplifier comprising:
an input matching circuit having an input terminal and an output terminal;
an amplifier transistor for amplifying an input signal received through the input matching circuit and output at the output terminal of the input matching circuit;
means for varying a collector voltage applied to the amplifier transistor;
a bias circuit for varying an idle current flowing in the amplifier transistor; and
a compensation circuit including a first capacitor and a variable capacitance connected to the first capacitor, wherein the fist capacitor and the variable capacitance are connected to the output terminal of the input matching circuit, the compensation circuit varying capacitance at the output terminal of the input matching circuit to maintain phase shift and input reflection of the power amplifier constant when the collector voltage and the idle current vary, and to prevent a decrease in efficiency of the power amplifier due to changes in output power of the amplifier transistor.

2. The power amplifier according to claim 1, further comprising a resistance connected in series with the first capacitor.

3. The power amplifier according to claim 2, wherein the resistance is a variable resistance.

4. The power amplifier according to claim 2, wherein the resistance is a semiconductor layer.

5. The power amplifier according to claim 1, further comprising an inductor connected in series to the first capacitor.

6. The power amplifier according to claim 1, further comprising an attenuator for attenuating the input signal.

7. A power amplifier comprising:
an input matching circuit having an input terminal and an output terminal;
an amplifier transistor for amplifying an input signal received through the input matching circuit and output at the output terminal of the input matching circuit;
means for varying a collector voltage applied to the amplifier transistor;
a bias circuit for varying an idle current flowing in the amplifier transistor; and
a compensation circuit consisting of two independently controllable variable capacitors connected to the output terminal of the input matching circuit, the compensation circuit varying capacitance at the output terminal of the input matching circuit to maintain phase shift and input reflection of the power amplifier constant when the collector voltage and the idle current vary, and to prevent a decrease in efficiency of the power amplifier due to changes in output power of the amplifier transistor.

8. The power amplifier according to claim 7, further comprising:
two wire bonding pads, each bonding pad being connected to one of the two variable capacitors; and
a ground terminal, wherein the ground terminal is connected to at least one of the wire bonding pads.

9. A power amplifier wherein:
an input matching circuit having an input terminal and an output terminal;
an amplifier transistor for amplifying an input signal received through the input matching circuit and output at the output terminal of the input matching circuit;
means for varying a collector voltage applied to the amplifier transistor;
a bias circuit for varying an idle current flowing in the amplifier transistor; and
a compensation circuit including a first diode which can be reverse biased and a second diode for connecting and disconnecting the first diode to and from the output terminal of the input matching circuit, the compensation circuit varying capacitance at the output terminal of the input matching circuit to maintain phase shift and input reflection of the power amplifier constant when the collector voltage and the idle current vary, and to prevent a decrease in efficiency of the power amplifier due to changes in output power of the amplifier transistor.

10. A power amplifier comprising:
an input matching circuit having an input terminal and an output terminal;
an amplifier transistor for amplifying an input signal received through the input matching circuit and output at the output terminal of the input matching circuit;
means for varying a collector voltage applied to the amplifier transistor;
a bias circuit for varying an idle current flowing in the amplifier transistor; and
a compensation circuit including a first capacitor and two diodes which may be connected to and disconnected from the output terminal of the output matching circuit, the compensation circuit varying capacitance at the output terminal of the input matching circuit by use of the two diodes to maintain phase shift and input reflection of the power amplifier constant when the collector voltage and the idle current vary, and to prevent a decrease in efficiency of the power amplifier due to changes in output power of the amplifier transistor.

11. A power amplifier comprising:
an input matching circuit having an input terminal and an output terminal;
an amplifier transistor for amplifying an input signal received through the input matching circuit and output at the output terminal of the input matching circuit;
means for varying a collector voltage applied to the amplifier transistor;
a bias circuit for varying an idle current flowing in the amplifier transistor; and a compensation circuit including a first capacitor, a field effect transistor (FET) having a gate and a drain, connecting and disconnecting the first capacitor to and from the output terminal of the input matching circuit, and a second capacitor connected between the gate and the drain of the FET, the compensation circuit varying capacitance at the output terminal of the input matching circuit to maintain phase shift and input reflection of the power amplifier constant when the collector voltage and the idle current vary, and to prevent a decrease in efficiency of the power amplifier due to changes in output power of the amplifier transistor.

* * * * *